United States Patent
Kawakami

(10) Patent No.: US 10,959,030 B2
(45) Date of Patent: Mar. 23, 2021

(54) SOUND OUTPUT CIRCUIT, PROJECTOR, AND CONTROL METHOD OF SOUND OUTPUT CIRCUIT

(71) Applicant: SEIKO EPSON CORPORATION, Tokyo (JP)

(72) Inventor: Masayuki Kawakami, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/277,484

(22) Filed: Feb. 15, 2019

(65) Prior Publication Data

US 2019/0261111 A1 Aug. 22, 2019

(30) Foreign Application Priority Data

Feb. 19, 2018 (JP) .............................. JP2018-026663

(51) Int. Cl.
*H04S 1/00* (2006.01)
*H03G 7/00* (2006.01)

(52) U.S. Cl.
CPC ............ *H04S 1/002* (2013.01); *H03G 7/002* (2013.01); *H03F 2200/03* (2013.01); *H04S 2400/13* (2013.01)

(58) Field of Classification Search
CPC combination set(s) only.
See application file for complete search history.

(56) References Cited

U.S. PATENT DOCUMENTS

| 2005/0083486 | A1* | 4/2005 | Johnson | G03B 29/00 353/15 |
| 2010/0148867 | A1* | 6/2010 | Chen | H03F 3/68 330/199 |
| 2011/0095614 | A1* | 4/2011 | Audy | H02J 1/10 307/80 |
| 2012/0293227 | A1* | 11/2012 | Daigle | H03K 19/00346 327/306 |
| 2013/0236025 | A1* | 9/2013 | Ma | H03G 3/348 381/74 |
| 2016/0100243 | A1* | 4/2016 | Wismar | H03F 3/187 381/74 |

(Continued)

FOREIGN PATENT DOCUMENTS

JP H2-141115 U 11/1990
JP 2004-112019 A 4/2004
(Continued)

OTHER PUBLICATIONS

Jerad Lewis; "Capless Headphone Virtual Ground Short-Circuit Protection for the ADAU1361 and ADAU1761 Low Power Codecs"; Analog Devices; pp. 1-2.

*Primary Examiner* — Duc Nguyen
*Assistant Examiner* — Assad Mohammed
(74) *Attorney, Agent, or Firm* — Oliff PLC

(57) ABSTRACT

A sound output circuit includes an amplifier that amplifies a sound signal, a first terminal for external connection connected to an output terminal of the amplifier, a reference voltage output that outputs a reference voltage, a second terminal for external connection, and a controller that controls a conduction state of an output terminal of the reference voltage output and the second terminal for external connection according to a voltage of the second terminal for external connection.

12 Claims, 2 Drawing Sheets

(56) References Cited

U.S. PATENT DOCUMENTS

2016/0127815 A1* 5/2016 Ookuri .................... H04R 1/06
  381/119
2017/0078815 A1* 3/2017 Miki ................... H04R 29/004

FOREIGN PATENT DOCUMENTS

| JP | 2004-289243 A | 10/2004 |
| JP | 2005-57624 A | 3/2005 |
| JP | 2010-288138 A | 12/2010 |

* cited by examiner

SOUND OUTPUT CIRCUIT, PROJECTOR, AND CONTROL METHOD OF SOUND OUTPUT CIRCUIT

The entire disclosure of Japanese Patent Application No. 2018-026663, filed Feb. 19, 2018 is expressly incorporated by reference herein.

BACKGROUND

1. Technical Field

The present invention relates to a sound output circuit, projector, and control method of the sound output circuit.

2. Related Art

Patent Document 1 (JP-A-2005-57624) discloses a portable sound reproducer (hereinafter, also referred to as "reproducer") including two terminals connected to a headphone jack. The reproducer may be referred to as "sound output circuit". Hereinafter, the two terminals connected to the headphone are referred to as "first terminal" and "second terminal". In the reproducer, a sound signal amplified by an amplifier is supplied to the first terminal and a reference voltage generated by a second amplifier is supplied to the second terminal. The sound signal varies between a ground voltage GND and a power supply voltage VDD. As the reference voltage, a half voltage of the power supply voltage VDD is used.

If a plug of a different apparatus from the headphone is inserted into the headphone jack and the second terminal is short-circuited to the ground terminal of the apparatus, an unnecessary current flows from the second terminal to the apparatus.

In the reproducer disclosed in Patent Document 1, to suppress the unnecessary current, a voltage detection circuit detects the voltage of the second terminal and outputs an activation command based on the detection result of the voltage. When the activation command is received by a power supply control circuit, the power supply control circuit suppresses the unnecessary current by stopping the operation of the first amplifier and the second amplifier.

In the reproducer disclosed in Patent Document 1, it is necessary for the power supply control circuit to receive the activation command for controlling the first amplifier and the second amplifier. Accordingly, it is necessary for the reproducer to have a control terminal that receives the activation command for controlling the first amplifier and the second amplifier.

SUMMARY

A sound output circuit according to an aspect of the invention includes an amplifier that amplifies a sound signal, a first terminal for external connection connected to an output terminal of the amplifier, a reference voltage output that outputs a reference voltage, a second terminal for external connection, and a controller that controls a conduction state of an output terminal of the reference voltage output and the second terminal for external connection according to a voltage of the second terminal for external connection.

According to the configuration, the conduction state of the output terminal of the reference voltage output and the second terminal for external connection is controlled according to the voltage of the second terminal for external connection. Accordingly, an unnecessary current flowing from the sound output circuit to an apparatus connected to the sound output circuit via the second terminal for external connection may be suppressed without control of the reference voltage output. Therefore, a command for controlling the reference voltage output is unnecessary and a control terminal for receiving the command is unnecessary.

In the sound output circuit, it is desirable that the controller sets the output terminal of the reference voltage output and the second terminal for external connection in a non-conduction state when the voltage of the second terminal for external connection is a ground voltage.

According to the configuration, when the voltage of the second terminal for external connection is the ground voltage, the output terminal of the reference voltage output and the second terminal for external connection are in the non-conduction state. Accordingly, an unnecessary current flowing from the output terminal of the reference voltage output via the second terminal for external connection may be suppressed.

In the sound output circuit, it is desirable that the controller includes a switch connected between the output terminal of the reference voltage output and the second terminal for external connection, and a switch controller that controls a conduction state of the switch according to the voltage of the second terminal for external connection.

According to the configuration, an unnecessary current flow may be suppressed by simple control of controlling the conduction state of the switch.

In the sound output circuit, it is desirable that the switch is an FET.

According to the configuration, for example, compared to the case where a bipolar transistor is used as a switch, an unnecessary current flow may be suppressed.

In the sound output circuit, it is desirable that an integrated circuit on which the first terminal for external connection, the second terminal for external connection, and the controller are not mounted, but the amplifier and the reference voltage output are mounted is provided, and the integrated circuit has no control terminal for receiving an output signal of the switch controller.

According to the configuration, an unnecessary current flowing from the reference voltage output may be also suppressed using the integrated circuit without the control terminal for receiving the output signal of the switch controller.

A projector according to an aspect of the invention includes the above described sound output circuit.

According to the configuration, also, in the projector, an unnecessary current flowing from the reference voltage output may be suppressed.

A control method of a sound output circuit according to an aspect of the invention is a control method of a sound output circuit including an amplifier that amplifies a sound signal, a first terminal for external connection connected to an output terminal of the amplifier, a reference voltage output that outputs a reference voltage, and a second terminal for external connection, and the control method includes controlling a conduction state of an output terminal of the reference voltage output and the second terminal for external connection according to a voltage of the second terminal for external connection.

According to the configuration, the conduction state of the output terminal of the reference voltage output and the second terminal for external connection is controlled according to the voltage of the second terminal for external connection. Accordingly, an unnecessary current flowing from the sound output circuit to an apparatus connected to the sound output circuit via the second terminal for external connection may be suppressed without control of the reference voltage output. Therefore, a command for controlling the reference voltage output is unnecessary and a control terminal for receiving the command is unnecessary.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
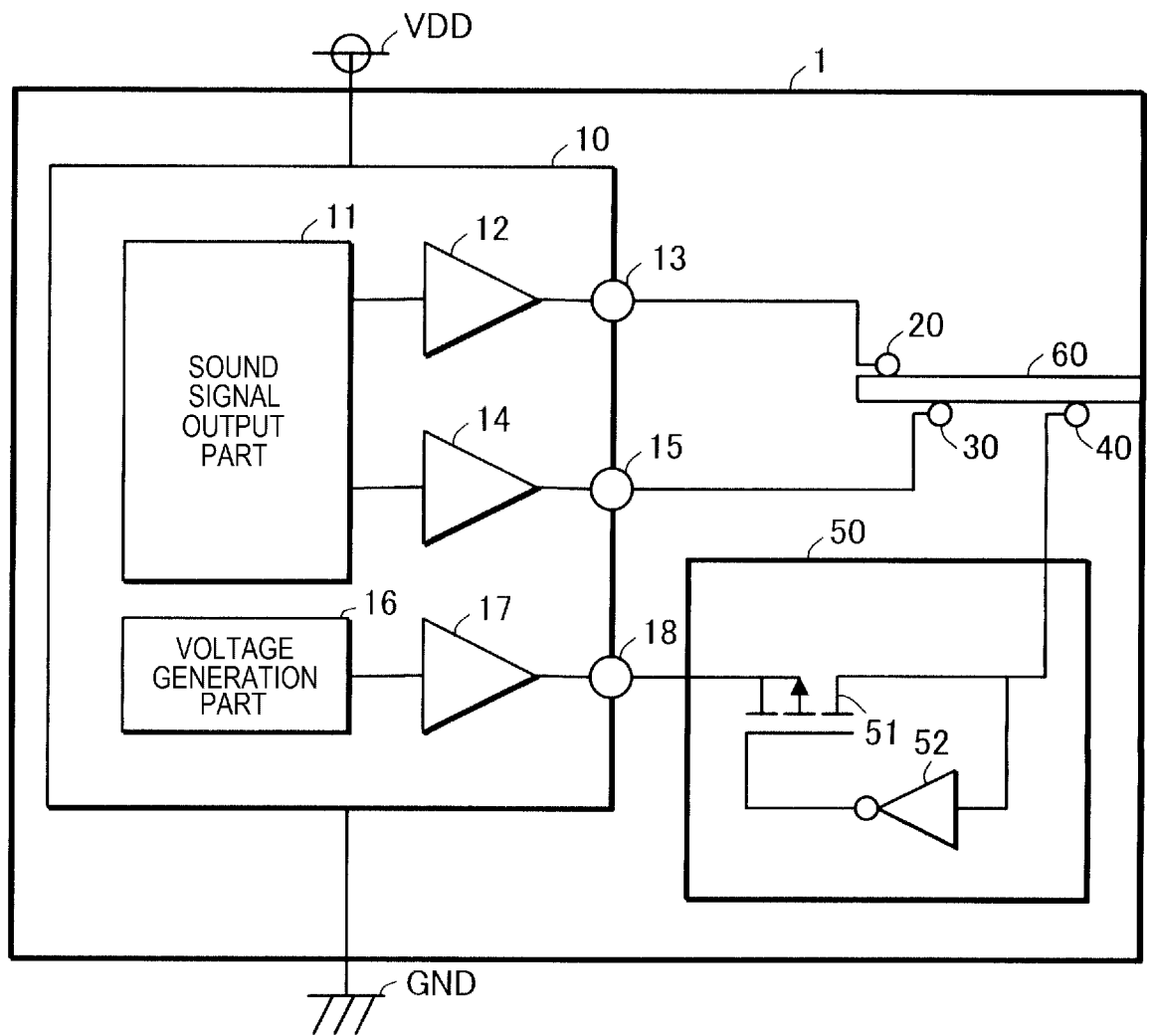
FIG. 1 shows a sound output circuit 1 according to the first embodiment.

As below, embodiments according to the invention will be explained with reference to the drawings. Note that, in the drawings, the dimensions and scaling of the respective parts are different from real ones as appropriate. Further, the embodiments to be described below are preferred specific examples of the invention. Accordingly, technically preferable various limitations are made to the embodiments. However, the scope of the invention is not limited to these embodiments unless there is description that particularly limits the invention in the following explanation.

First Embodiment

FIG. 1 shows a sound output circuit 1 according to the first embodiment.

The sound output circuit 1 includes an IC (Integrated Circuit) 10 as an integrated circuit, a left sound signal terminal 20, aright sound signal terminal 30, a common terminal 40, a controller 50, and a headphone jack 60.

The IC 10 includes a sound signal output 11, a first amplifier 12, a first output terminal 13, a second amplifier 14, a second output terminal 15, a voltage generator 16, a third amplifier 17, and a third output terminal 18.

The sound signal output 11 outputs a left sound signal to the first amplifier 12 and outputs a right sound signal to the second amplifier 14. The left sound signal and the right sound signal form a stereo signal. Each of the left sound signal and the right sound signal is a voltage signal. The left sound signal is an example of a sound signal. The right sound signal is another example of the sound signal.

The first amplifier 12 is an example of an amplifier. The first amplifier 12 amplifies the left sound signal. The first amplifier 12 outputs the amplified left sound signal to the first output terminal 13. The first output terminal 13 is an example of an output terminal of the amplifier.

The second amplifier 14 is another example of the amplifier. The second amplifier 14 amplifies the right sound signal. The second amplifier 14 outputs the amplified right sound signal to the second output terminal 15. The second output terminal 15 is another example of the output terminal of the amplifier.

The voltage generator 16 generates a voltage having a predetermine value using a power supply voltage VDD and a ground voltage GND.

The third amplifier 17 is an example of a reference voltage output. The third amplifier 17 generates a reference voltage as a half voltage of the power supply voltage VDD using the voltage having the predetermine value generated by the voltage generator 16. The voltage generator 16 outputs the reference voltage to the third output terminal 18. The third output terminal 18 is an example of an output terminal of the reference voltage output.

The left sound signal terminal 20, the right sound signal terminal 30, and the common terminal 40 are provided in the headphone jack 60. The left sound signal terminal 20, the right sound signal terminal 30, and the common terminal 40 are connected to a plug inserted into the headphone jack 60.

The voltage of the common terminal 40 varies according to the type of an apparatus having the plug inserted into the headphone jack 60 or the like. Note that, when the plug of the headphone is inserted into the headphone jack 60, a voltage as a half of the power supply voltage VDD is applied to the common terminal 40 due to load of the headphone or the like.

The left sound signal terminal 20 is an example of a first terminal for external connection. The left sound signal terminal 20 is connected to the first output terminal 13.

The right sound signal terminal 30 is another example of the first terminal for external connection. The right sound signal terminal 30 is connected to the second output terminal 15.

The common terminal 40 is an example of a second terminal for external connection. The common terminal 40 is connected to the controller 50.

The controller 50 controls the conduction state of the third output terminal 18 and the common terminal 40 according to the voltage of the common terminal 40. As described above, the voltage of the common terminal 40 varies according to the type of the apparatus having the plug inserted into the headphone jack 60 or the like. Accordingly, the controller 50 controls the conduction state of the third output terminal 18 and the common terminal 40 according to the type of the apparatus having the plug inserted into the headphone jack 60 or the like.

For example, when the voltage of the common terminal 40 is the ground voltage GND, the controller 50 sets the third output terminal 18 and the common terminal 40 in a non-conduction state.

The controller 50 includes a P-channel MOSFET (metal oxide semiconductor field effect transistor) 51 and an inverter 52.

The P-channel MOSFET 51 is an example of a switch. The source of the P-channel MOSFET 51 is connected to the third output terminal 18. The drain of the P-channel MOSFET 51 is connected to the common terminal 40. The gate of the P-channel MOSFET 51 is connected to the output stage of the inverter 52.

The inverter 52 is an example of a switch controller. The inverter 52 controls the conduction state of the P-channel MOSFET 51 according to the voltage of the common terminal 40. Note that the IC 10 has no control terminal for receiving the output signal of the inverter 52.

Figure 2:
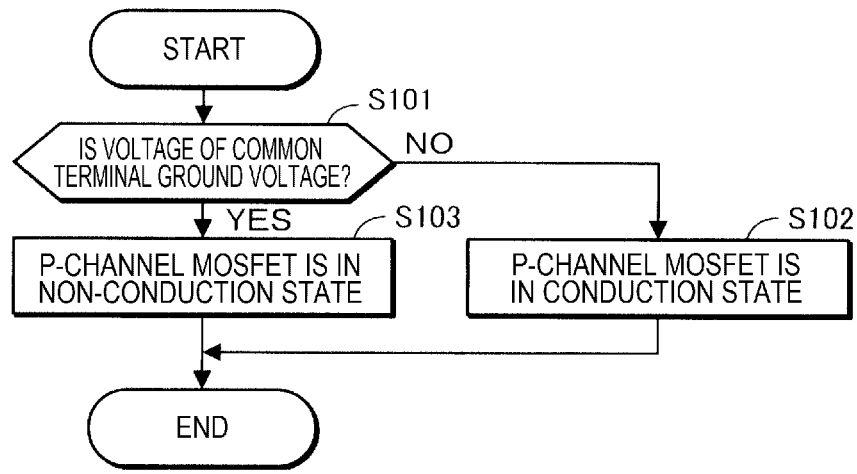
FIG. 2 is a flowchart for explanation of an operation of the sound output circuit 1.

Next, an operation will be explained. FIG. 2 is a flowchart for explanation of an operation of the sound output circuit 1.

First, an operation when the plug of the headphone is inserted into the headphone jack 60 is explained.

When the plug of the headphone is inserted into the headphone jack 60, the left sound signal terminal 20 and the common terminal 40 are connected via load for left sound of the headphone, the right sound signal terminal 30 and the common terminal 40 are connected via load for right sound of the headphone. Further, the voltage as the half of the power supply voltage VDD is applied to the common terminal 40.

If the voltage as the half of the power supply voltage VDD is applied to the common terminal 40 (step S101: NO), the output of the inverter 52 becomes "0" and the P-channel MOSFET 51 conducts (step S102).

Accordingly, both the common terminal 40 and the third output terminal 18 are conducted with the voltage as the half of the power supply voltage VDD applied thereto, and the headphone normally operates.

Next, the case where a plug of a different apparatus from the headphone, e.g., a plug of a speaker with built-in amplifier is inserted into the headphone jack 60 is explained.

When the plug of the speaker with built-in amplifier is inserted into the headphone jack 60, the common terminal 40 is connected to the ground terminal of the speaker with built-in amplifier and the voltage of the common terminal 40 becomes the ground voltage GND.

If the common terminal 40 becomes the ground voltage GND (step S101: YES), the output of the inverter 52 becomes "1" and the P-channel MOSFET 51 is in the non-conduction state, i.e., at high impedance (step S103).

Accordingly, the third output terminal 18 is in the non-conduction state to the common terminal 40, and an unnecessary current flowing from the sound output circuit 1 to the apparatus connected to the sound output circuit 1 via the common terminal 40 may be suppressed.

According to the sound output circuit 1 and the control method of the sound output circuit 1, the conduction state of the third output terminal 18 and the common terminal 40 is controlled according to the voltage of the common terminal 40. Accordingly, an unnecessary current flowing from the sound output circuit 1 to the apparatus connected to the sound output circuit 1 via the common terminal 40 may be suppressed without control of the third amplifier 17. Therefore, a command for controlling the third amplifier 17 is unnecessary and a control terminal for receiving the command can be made unnecessary.

When the voltage of the common terminal 40 is the ground voltage GND, the controller 50 sets the third output terminal 18 and the common terminal 40 in the non-conduction state. Accordingly, an unnecessary current flowing from the third output terminal 18 via the common terminal 40 may be suppressed.

The controller 50 includes the P-channel MOSFET 51 connected between the third output terminal 18 and the common terminal 40, and the inverter 52 that controls the conduction state of the P-channel MOSFET 51 according to the voltage of the common terminal 40. Accordingly, compared to the case where a bipolar transistor is used in place of the P-channel MOSFET 51, an unnecessary current flowing may be suppressed.

The left sound signal terminal 20, the right sound signal terminal 30, the common terminal 40, and the controller 50 are not mounted on the IC 10, but the first amplifier 12, the second amplifier 14, and the third amplifier 17 are mounted thereon. Further, the IC 10 has no control terminal for receiving the output signal of the inverter 52. That is, even when the IC 10 without the control terminal for receiving the output signal of the inverter 52, e.g., an inexpensive IC having few functions is used, an unnecessary current flow from the third amplifier 17 may be suppressed.

Note that, if the IC 10 has the control terminal for receiving the output signal of the inverter 52, an unnecessary current flowing from the third amplifier 17 may be also suppressed. Accordingly, in the embodiment, the degree of freedom of selection with respect to the IC 10 is higher.

Second Embodiment

The second embodiment is a projector including the sound output circuit 1 shown in FIG. 1.

Figure 3:
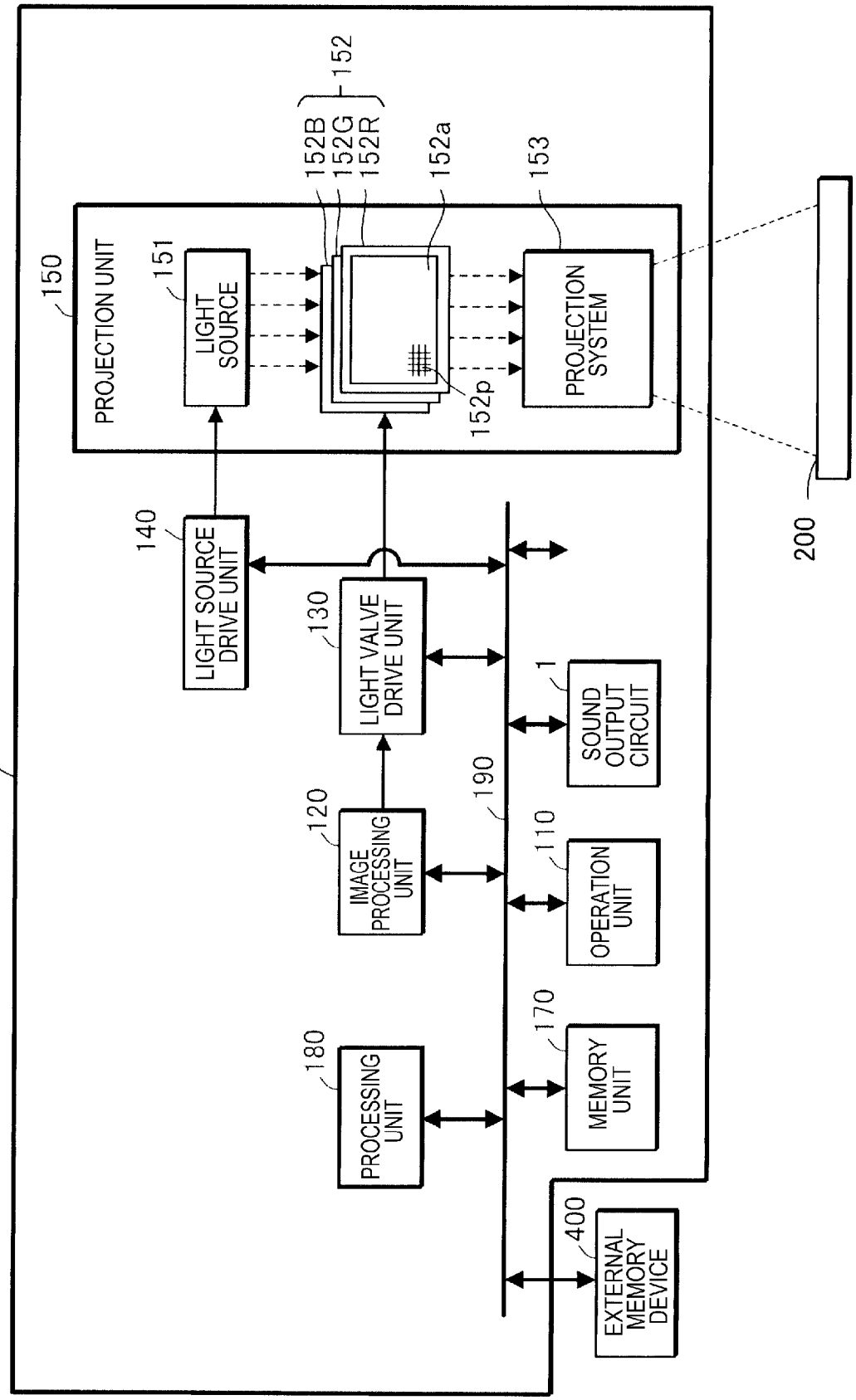
FIG. 3 shows an example of a projector 100 including the sound output circuit 1.

FIG. 3 shows an example of a projector 100 including the sound output circuit 1.

The projector 100 includes the sound output circuit 1, an operation unit 110, an image processing unit 120, a light valve drive unit 130, a light source drive unit 140, a projection unit 150, a memory unit 170, a processing unit 180, and a bus 190. The projection unit 15 includes a light source 151, three liquid crystal light valves 152R, 152G, and 152B, and a projection system 153. Hereinafter, the three liquid crystal light valves 152R, 152G, and 152B will be collectively referred to as "liquid crystal light valves 152".

An external memory device 400 is connected to the projector 100 via an interface (not shown). The external memory device 400 is e.g. a card-type recording medium such as an SD memory card or USB (Universal Serial Bus) memory device.

The sound output circuit 1, the operation unit 110, the image processing unit 120, the light valve drive unit 130, the light source drive unit 140, the memory unit 170, the processing unit 180, and the external memory device 400 are mutually communicable via the bus 190.

The external memory device 400 stores content information containing image information and sound information.

The operation unit 110 is e.g. various operation buttons, operation keys, or touch panels. The operation unit 110 receives input operations by a user of the projector 100 (hereinafter, simply referred to as "user"). The operation unit 110 may be a remote controller that transmits information according to the input operation by the user via wireless or wired connection or the like. In this case, the projector 100 includes a receiving unit that receives information transmitted by the remote controller. The remote controller includes various operation buttons, operation keys, or touch panels that receive input operations by the user.

The image processing unit 120 performs image processing on image information stored in the external memory device 400 and generates an image signal.

The light valve drive unit 130 drives the liquid crystal light valves 152 based on the image signal generated by the image processing unit 120.

The light source drive unit 140 drives the light source 151. For example, the light source drive unit 140 allows the light source 151 to emit light when the operation unit 110 receives a power-on operation.

The projection unit 150 projects an image according to the image signal, in other words, an image according to the image information on a projection surface 200. In the projection unit 150, the light emitted from the light source 151 is modulated by the liquid crystal light valves 152 and image light as an image according to the image signal is generated, and the image light is enlarged and projected from the projection system 153 on the projection surface 200.

The light source 151 is a xenon lamp, ultrahigh-pressure mercury lamp, LED (Light Emitting Diode), laser light source, or the like. The light source 151 emits light. The variations in brightness distribution of the light emitted from the light source 151 are reduced by an optical integration system (not shown), and then, the light is separated into color light components of red R, green G, blue B as three primary colors of light by a color separation system (not shown). The color light components of R, G, B enter the liquid crystal light valves 152R, 152G, 152B, respectively.

The liquid crystal light valve 152 is an example of a light modulation device. The liquid crystal light valve 152 modulates the light emitted by the light source 151 and generates image light according to the image signal. The liquid crystal light valve 152 is formed by a liquid crystal panel with liquid crystal enclosed between a pair of transparent substrates or the like. In the liquid crystal light valve 152, a rectangular pixel area 152a including a plurality of pixels 152p arranged in a matrix form is formed. In the liquid crystal light valve 152, a drive voltage is applied to the liquid crystal with respect to each pixel 152p.

When the light valve drive unit 130 applies the drive voltages according to the image signal to the respective pixels 152p, the respective pixels 152p are set to light transmittance according to the image signal. Accordingly, the light emitted by the light source 151 is transmitted through the pixel area 152a and modulated and images according to the image signal are formed for the respective color lights. The images of the respective colors are combined by a light combining system (not shown) with respect to each pixel 152p and color image light is obtained.

The projection system 153 enlarges and projects the image light generated by the liquid crystal light valves 152 on the projection surface 200.

The memory unit 170 is a computer-readable recording medium. The memory unit 170 stores programs that specify the operations of the projector 100 and various kinds of information.

The processing unit 180 is a computer such as a CPU (Central Processing Unit). The processing unit 180 may be formed by one or more processors. The processing unit 180 controls e.g. the sound output circuit 1, the image processing unit 120, the light valve drive unit 130, and the light source drive unit 140 by reading and executing programs stored in the memory unit 170.

In the sound output circuit 1, the sound signal output 11 generates the left sound signal and the right sound signal based on the sound information stored in the external memory device 400. The sound signal output 11 outputs the generated left sound signal to the first amplifier 12 and outputs the generated right sound signal to the second amplifier 14.

According to the embodiment, also, in the projector 100, an unnecessary current flowing through the third amplifier 17 can be suppressed.

MODIFIED EXAMPLES

The invention is not limited to the above described embodiment, but e.g. various modifications to be described later can be made. Further, one or more modifications arbitrarily selected from the following modifications may be appropriately combined.

Modified Example 1

In the controller 50, the P-channel MOSFET 51 is used as the example of the switch, however, the switch is not limited to the P-channel MOSFET 51, but can be changed as appropriate.

For example, in place of the P-channel MOSFET 51, a P-channel JFET (Junction Field Effect Transistor), P-channel MESFET (metal semiconductor field effect transistor), or PNP bipolar transistor may be used.

Or, in place of the P-channel MOSFET 51, an N-channel MOSFET, N-channel JFET, N-channel MESFET, or NPN bipolar transistor may be used. In this case, a buffer is used in place of the inverter 52 or the inverter 52 is omitted.

Modified Example 2

The sound signal output 11 may output monaural sound signals in place of the left sound signal and the right sound signal to the first amplifier 12 and the second amplifier 14.

In the case where the sound signal output 11 may output monaural sound signals, for example, the first amplifier 12, the first output terminal 13, and the left sound signal terminal 20 may be omitted or the second amplifier 14, the second output terminal 15, and the right sound signal terminal 30 may be omitted.

Modified Example 3

The different apparatus from the headphone is not limited to the headphone with built-in amplifier having the plug that can be inserted into the headphone jack 60, but can be changed as appropriate. For example, the different apparatus from the headphone may be a PC (Personal Computer) having a connection terminal for audio input. In this case, the PC and the sound output circuit 1 are connected via a cable.

Modified Example 4

The projector 100 shown in FIG. 3 may have a speaker. In this case, the user may listen to sound not only using the headphone, but via the speaker. Accordingly, the usage scene of the projector 100 may be extended.

Modified Example 5

The sound signal output 11 may be realized by hardware using e.g. an electronic circuit such as an FPGA (field programmable gate array) or ASIC (Application Specific IC) or realized in cooperation of software and hardware.

Modified Example 6

The crystal light valves 152 are used as light modulation devices, however, the light modulation devices are not limited to the crystal light valves 152, but can be changed as appropriate. For example, the light modulation device may have a configuration using three reflective liquid crystal panels. Further, the light modulation device may have a configuration using a single liquid crystal panel, three digital mirror devices (DMDs), or a single digital mirror device. In the case where only one liquid crystal panel or DMD is used as the light modulation device, the members corresponding to the color separation system and the light combining system are not necessary. Or, not only the liquid crystal panel or DMD but also a configuration that can modulate the light emitted by the light source 151 may be employed as a light modulation device.

Modified Example 7

The sound signal output 11 may use a sound signal received from an external apparatus such as a PC in place of sound information stored in the external memory device 400.

What is claimed is:

1. A sound output circuit comprising:
   an amplifier that amplifies a sound signal;
   a first terminal for external connection connected to an output terminal of the amplifier;
   a reference voltage output that outputs a reference voltage;
   a second terminal for external connection; and
   a controller that controls a conduction state of an output terminal of the reference voltage output and the second terminal for external connection according to a voltage of the second terminal for external connection, wherein the controller includes:
      a switch connected between the output terminal of the reference voltage output and the second terminal for external connection; and
      a switch controller that controls a conduction state of the switch according to the voltage of the second terminal for external connection, the switch controller being connected between the output terminal of the reference voltage output and the second terminal for external connection, and being further connected between the switch and the second terminal.

2. The sound output circuit according to claim 1, wherein the controller sets the output terminal of the reference voltage output and the second terminal for external connection in a non-conduction state when the voltage of the second terminal for external connection is a ground voltage.

3. The sound output circuit according to claim 1, wherein the switch is an FET.

4. The sound output circuit according to claim 1, further comprising:
   an integrated circuit on which the first terminal for external connection, the second terminal for external connection, and the controller are not mounted, but the amplifier and the reference voltage output are mounted, wherein the integrated circuit has no control terminal for receiving an output signal of the switch controller.

5. A projector comprising the sound output circuit according to claim 1.

6. A projector comprising the sound output circuit according to claim 2.

7. A projector comprising the sound output circuit according to claim 3.

8. A projector comprising the sound output circuit according to claim 4.

9. A control method of a sound output circuit including an amplifier that amplifies a sound signal, a first terminal for external connection connected to an output terminal of the amplifier, a reference voltage output that outputs a reference voltage, and a second terminal for external connection, the control method comprising:
   controlling, by the controller, a conduction state of an output terminal of the reference voltage output and the second terminal for external connection according to a voltage of the second terminal for external connection, the controller including a switch connected between the output terminal of the reference voltage output and the second terminal for external connection, and a switch controller connected between the output terminal of the reference voltage output and the second terminal for external connection, and further connected between the switch and the second terminal; and
   controlling, by the switch controller, a conduction state of the switch according to the voltage of the second terminal for external connection.

10. The sound output circuit according to claim 3, wherein the switch controller is an inverter.

11. The sound output circuit according to claim 10, wherein
    a source of the FET is connected to the output terminal of the reference voltage output,
    a drain of the FET is connected to the second terminal, and
    a gate of the FET is connected to an output stage of the inverter.

12. A sound output circuit comprising:
    an amplifier that amplifies a sound signal;
    first terminals for external connection, the first terminals including:
       a left sound signal terminal for external connection connected to an output terminal of the amplifier; and
       a right sound signal terminal for external connection connected to the output terminal of the amplifier;
    a reference voltage output that outputs a reference voltage;
    a second terminal for external connection; and
    a controller that controls a conduction state of an output terminal of the reference voltage output and the second terminal for external connection according to a voltage of the second terminal for external connection, wherein the controller includes:
       a switch connected between the output terminal of the reference voltage output and the second terminal for external connection; and
       a switch controller that controls a conduction state of the switch according to the voltage of the second terminal for external connection, the switch controller being connected between the output terminal of the reference voltage output and the second terminal for external connection, and being further connected between the switch and the second terminal.

* * * * *